United States Patent [19]
Watanabe et al.

[11] Patent Number: 4,677,529
[45] Date of Patent: Jun. 30, 1987

[54] CIRCUIT BOARD

[75] Inventors: Masamichi Watanabe; Yasushi Watanabe, both of Miyagi, Japan

[73] Assignee: Alps Electric Co., Ltd.

[21] Appl. No.: 838,778

[22] Filed: Mar. 12, 1986

[30] Foreign Application Priority Data

Mar. 12, 1985 [JP] Japan .................................. 36002/85

[51] Int. Cl.⁴ ............................................ H05K 01/18
[52] U.S. Cl. .................... 361/414; 338/115; 338/184; 361/398
[58] Field of Search .............. 361/414, 398; 364/701, 364/700; 338/115, 172, 173, 184

[56] References Cited

U.S. PATENT DOCUMENTS

| | | | |
|---|---|---|---|
| 3,657,494 | 4/1972 | Gargini | 361/414 X |
| 4,105,987 | 8/1978 | Spence et al. | 338/184 X |
| 4,206,334 | 6/1980 | LaRock | 338/184 X |
| 4,359,277 | 11/1982 | Shimizu et al. | 361/414 X |
| 4,453,152 | 6/1984 | Dob et al. | 338/172 X |
| 4,495,524 | 1/1985 | Kakuhashi et al. | 338/115 X |
| 4,532,575 | 7/1985 | Suwa | 361/398 X |

FOREIGN PATENT DOCUMENTS 1190128  4/1970  United Kingdom ................ 361/414

Primary Examiner—R. R. Kucia
Attorney, Agent, or Firm—Guy W. Shoup

[57] ABSTRACT

A circuit board for use in a keyboard has a lower insulating sheet, an insulating sheet, and an upper insulating sheet stacked on top of each other. Switch circuit patterns are formed on the upper and lower insulating sheets so as to be opposed to each other. Circuit patterns acting as electrical parts such as rheostats are formed on the insulating spacer.

7 Claims, 7 Drawing Figures

CIRCUIT BOARD

FIELD OF THE INVENTION

The present invention relates to a circuit board and, more particularly, to a circuit board for use in a keyboard.

BACKGROUND OF THE INVENTION

A conventional circuit board for use in a keyboard is shown in FIGS. 6 and 7, where the board is indicated by reference numeral 28. This board 28 consists of a first pattern sheet 25, a second pattern sheet 26, and an insulating sheet 27 sandwiched between the pattern sheets 25 and 26. Each of the pattern sheets is made from a flexible insulating material and has a circuit pattern arranged thereon such that the circuit patterns on the two sheets 25 and 26 are opposed to each other. The insulating sheet 27 is provided with a hole. When the circuit board 28 and electrical parts 30 such as rheostats are mounted, the board 28 is joined to a support base 29, while the terminals 33 of the electrical parts 30 are inserted into holes 32 formed in a printed circuit board 31 that is provided independent of the circuit board 28. The terminals 33 of the parts 30 are connected with the circuits of the printed circuit board 31 as by soldering. The circuit board 28 has edge connectors 22c and 22d for making connections to other circuits. Also, the printed circuit board 31 on which the electrical parts 30 are mounted has an edge connector 34 for making connections with other circuits.

However, the edge connectors for making connections to an external circuit and an insulating circuit board having resistors, for example, thereon are indispensable to the electrical parts such as rheostats. Further, the electrical parts are required to be mounted above the surface of the printed circuit board in a spaced relation from the surface to prevent flux from flowing into the electrical parts when the parts are soldered to the printed circuit board. For these reasons, such a problem arises that the assembly of the printed circuit board and the electrical parts has a large height. Therefore, in spite of the fact that the circuit board forming a portion of a control panel is thin, the whole control panel occupies a considerable portion of the volume of the electrical product. This makes it difficult to manufacture the product in small size and small thickness. Another problem with the prior art structure is that the printed circuit board on which electrical parts are mounted and the edge connectors formed on the printed circuit board are necessary. Further, soldering operations are needed to make connections with these portions. Hence, the product is expensive to fabricate

SUMMARY OF THE INVENTION

Accordingly, it is the object of the present invention to provide a circuit board which allows an electrical product to be manufactured in small size and small thickness, is made up of a less number of components than conventional, can be fabricated with a less number of manufacturing steps than conventional, and is inexpensive to manufacture.

The above object is achieved by a circuit board having a lower insulating sheet, an insulating spacer, and an upper insulating sheet which are stacked on top of each other in this order, the upper and lower insulating sheets having their respective switch circuit patterns opposed to each other, the insulating spacer having circuit patterns which act as electrical parts such as rheostats. At least one of the two insulating sheets is flexible film. The insulating spacer can be a filmy body printed on the film forming the insulating sheet. In this case, subsequent to the printing of the insulating spacer, said circuit patterns acting as the electrical parts such as rheostats can be easily formed by printing process. Further, it is not necessary that the film constituting the insulating spacer is bonded to the insulating sheets with bonding members.

Preferably, the terminals of the circuit patterns formed on the insulating spacer are connected with the leads in the switch patterns formed on the insulating sheet. This allows the terminals of the circuit board on the insulating spacer to be introduced in a set of terminals formed around one end of the insulating sheet via leads on the insulating sheet, the first mentioned terminals of the circuit board being adapted to be connected to a circuit outside the circuit board rather than directly connected with the switch circuit patterns on the insulating sheet. Where the connection with the external circuit is made by printing using conductive ink, the circuit board can be manufactured by a continuous printing operation including the formation of the insulating spacer and the formation of the circuit patterns on the insulating spacer. Thus, the circuit board can be manufactured in a sufficiently controlled manner and inexpensively.

DETAILED DESCRIPTION OF THE INVENTION

Figure 1:
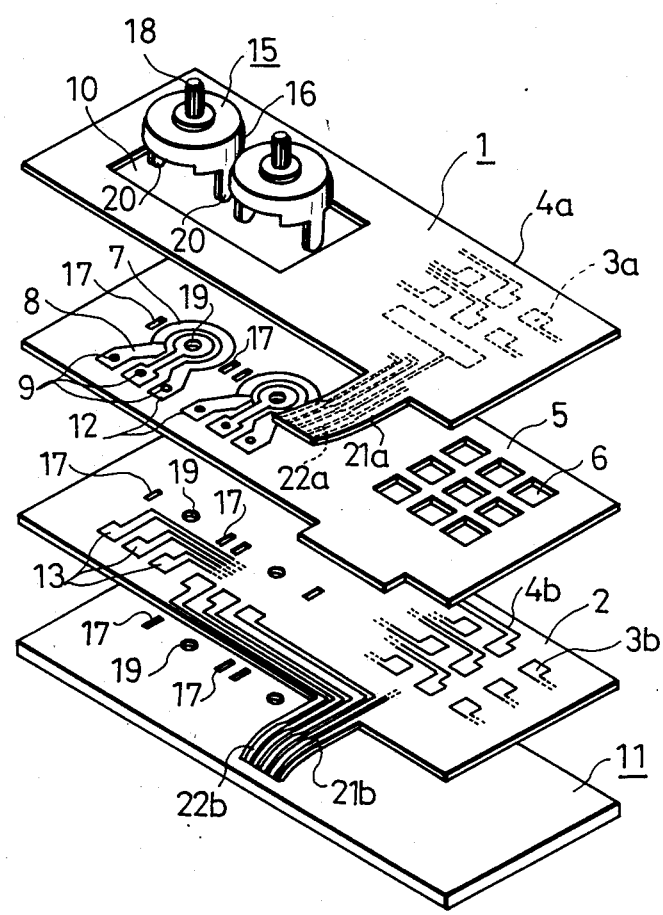
FIG. 1 is an exploded perspective view of a circuit board according to the invention.
Figure 2:
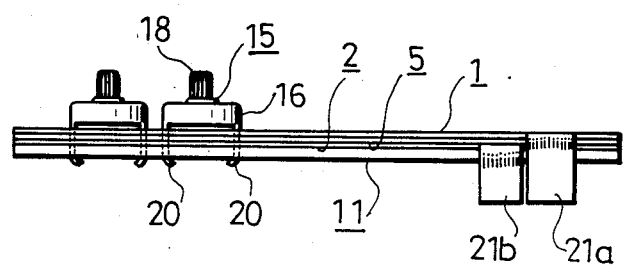
FIG. 2 is a front elevation of the circuit board shown in FIG. 1.

Referring to FIGS. 1 and 2, there is shown a circuit board according to the present invention. This board has upper and lower insulating sheets which are formed by first and second pattern sheets 1 and 2, respectively. These insulating sheets are made from polyethylene terephthalate, polyimide, or other resin. A contact pattern 3a and a circuit pattern 4a are printed with conductive ink on the first sheet 1. Similarly, a contact pattern 3b and a circuit pattern 4b are printed with conductive ink on the second sheet 2. These patterns 3a, 4a and 3b, 4b are formed so as to be opposed to each other, for making a switch that is closed when depressed. An insulating spacer 5 in the form of a sheet is made from polyethylene terephthalate, polyimide, or other resin exhibiting flexibility, or it is made of a laminate consisting of phenolic resin or epoxy resin. The spacer 5 is provided with holes 6 for allowing the switch to be closed. Also, the spacer 5 has circuit patterns 8 formed by printing at other locations, the patterns 8 acting as electrical parts such as rheostats. Print patterns 7 form portions of the circuit patterns 8, which are formed with holes 9 for connection with the circuit patterns on the second pattern sheet 2. The first pattern sheet 1 has an opening 10 so that the circuit patterns 8 on the insulating spacer 5 are partially exposed.

A support plate 11 is a hard plate such as a laminated plate or iron plate. The second pattern sheet 2, the insulating spacer 5, and the first pattern sheet 1 are stacked on the support plate 11 in this order and bonded to the plate 11 with bonding member such as adhesive or double-sided adhesive tape.

Figure 3:
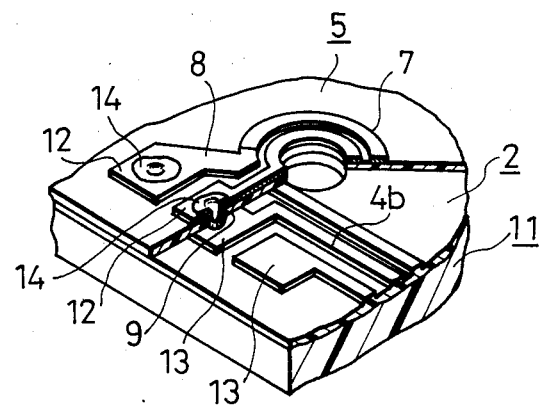
FIG. 3 is a fragmentary perspective view of the circuit board shown in FIGS. 1 and 2, for showing the joint between the circuit pattern of one electrical part and a circuit pattern on a second pattern sheet.

Referring next to FIG. 3, each first connector pattern 12 extends from the circuit pattern 8 of the electrical part on the insulating spacer 5 to the fringe of each hole 9. Each second connector pattern 13 extends to a position at which it is exposed through each opening 9 in the insulating spacer 5, under the condition that the insulating spacer 5 is stacked on the second pattern sheet 2. The first connector patterns 12 are electrically connected with their respective second connector patterns 13 by electrically conductive connector member 14 which fills the holes 9 and is an electrically conductive adhesive or the like. Thus, a circuit board is formed.

Referring back to FIGS. 1 and 2, round holes 19 extend through the second pattern sheet 2, the insulating spacer 5, and the support plate 11 of the circuit board constructed as described above. The casings 16 of the mechanisms 15 of the electrical parts are mounted to rectangular shafts 18 which are rotatably held by the holes 19. The mechanism 15 of each electrical part is composed of the casing 16 that is open on its lower side, a slider support (not shown) on which a slider (not shown) sliding on the circuit surface on the insulating spacer 5, and the rotatable shaft 18 fixed in coaxial relation to the the slider support. Retaining portions 20 extend downward from the ends of the opening of the casing 16, and are inserted in rectangular holes 17 formed in the circuit board. The end of the shaft 18 is inserted in the round hole 19. The lower ends of the retaining portions 20 are bent so that the mechanisms 15 of the electrical parts are anchored to the circuit board. The first pattern sheet 1 has an edge connector 21a which extends outwardly from one side of the sheet. Similarly, the second insulating sheet 2 has an edge connector 21b extending outwardly from its one side. These edge connectors have terminals 22a and 22b which form the ends of the circuit patterns on the pattern sheets. The terminals 22b on the second pattern sheet 2 include the output terminals of the circuit patterns of the electrical parts on the insulating spacer 5.

Figure 4:
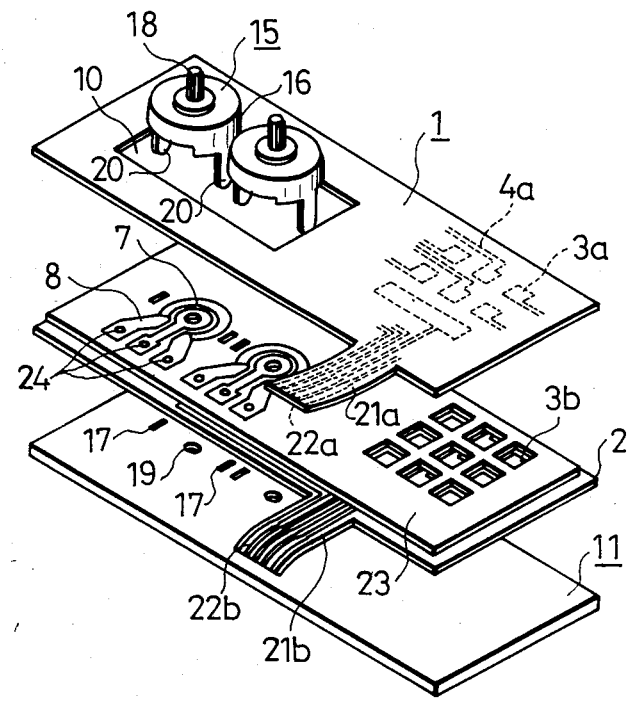
FIG. 4 is an exploded perspective view of another circuit board according to the invention.
Figure 5:
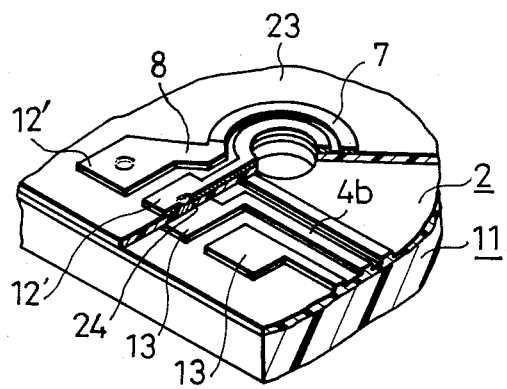
FIG. 5 is a fragmentary perspective view of the circuit board shown in FIG. 4, for showing the joint between the circuit pattern of one electrical part and a circuit pattern on a second pattern sheet.
Figure 6:
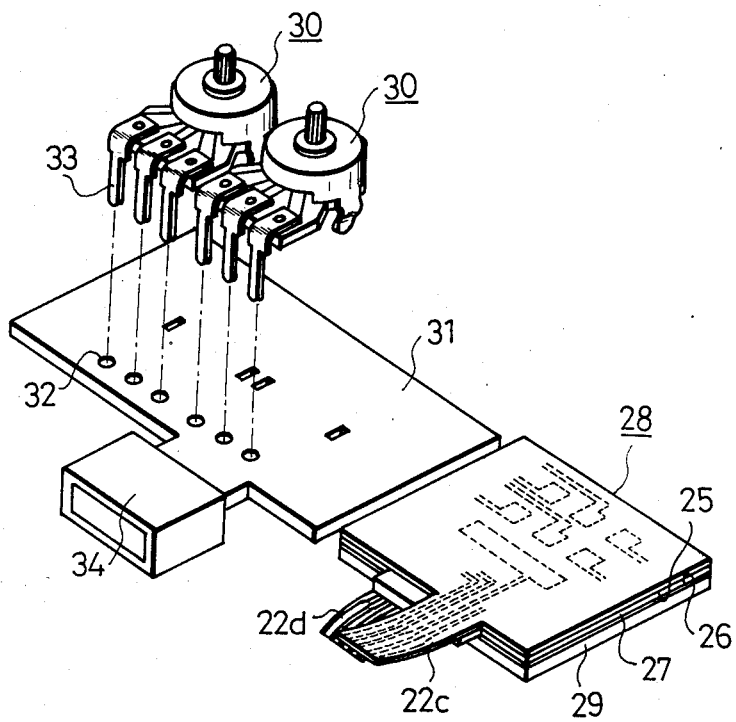
FIG. 6 is a perspective view of a conventional circuit board.
Figure 7:
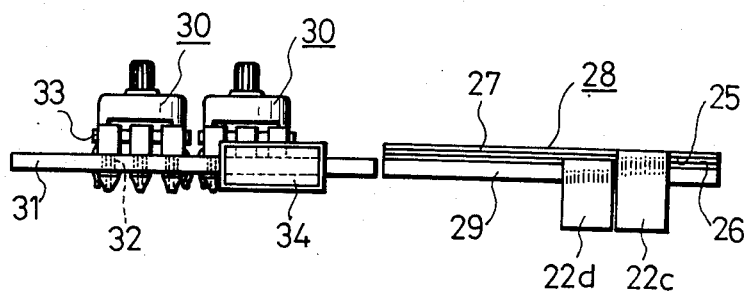
FIG. 7 is a front elevation of the circuit board shown in FIG. 6.

Referring next to FIGS. 4 and 5, there is shown another circuit board according to the invention. It is to be noted that like components are denoted by like reference numerals throughout FIGS. 1-5, and they will not be described hereinafter for simplicity. Switch circuit patterns (not shown) including the contact patterns 3b are printed with conductive ink on the second pattern sheet 2. Insulating ink is applied to the second pattern sheet 2, except for the contact patterns 3b the edge connector 22b, and the holes 24 for making connections of the circuit patterns 8 of the electrical parts with the circuit patterns on the sheet 2, to form an insulating spacer 23. The circuit patterns 8 of the electrical parts such as rheostats are formed on the spacer 23 by printing. The circuit patterns 8 include first connecting patterns 12' overlying the surface of second connecting patterns 13 which extend from circuit patterns 4b on the second pattern sheet 2, the second patterns 13 being partially exposed at holes 24. Thus, the circuit patterns 8 of the electrical parts on the insulating spacer 23 are electrically connected with the circuit patterns 4b on the second pattern sheet 2 to thereby form a circuit board.

A first pattern sheet 1 is placed on and bonded to the laminate formed as described above. A support plate 11 is bonded to the underside of the laminate. For these bonding operations, bonding member such as adhesive or double-sided tape is inserted between neighboring layers. Then, the mechanisms 15 of the electrical parts are mounted in the same manner as in the circuit board already described in connection with FIGS. 1-3.

In the above examples, the electrical parts include rotary type rheostats, rectilinearly sliding type rheostats, rotary type switches, rectilinearly sliding rheostats, and fixed resistors.

As described thus far, the novel circuit board according to the invention has a lower insulating sheet, an insulating spacer, and an upper insulating sheet which are stacked on top of each other in this order, the upper and lower insulating sheets having their respective switch circuit patterns opposed to each other. The insulating spacer has circuit patterns acting as electrical parts such as rheostats. Therefore, the laminate consisting of the insulating spacer in the form of a sheet, pattern sheets, and a support plate can be used as an insulating plate on which circuit patterns of electrical parts such as rheostats are formed, the laminate essentially forming a key unit. Terminals for making connections to an external circuit is made unnecessary. Further, a printed circuit board on which electrical parts are mounted is dispensed with. In addition, it is not necessary that electrical parts are mounted above said printed circuit board in a spaced relation from the board to prevent flux from flowing into the electrical parts. Hence, the height of the structure on which the mechanisms of the electrical parts is made low. Consequently, the product can be manufactured in small size and small thickness. Furthermore, the novel circuit board can be made up of a less number of components than conventional. Additionally, soldering operation can be omitted. These contribute to a reduction in the manufacturing cost.

What is claimed is:

1. A composite circuit board for combined use as a keyboard and mounting for at least one electrical part of the type having a casing, a slide contact in the casing, a fixed circuit pattern conductively contactable by the slide contact, and terminals conductively connected to the fixed contact pattern, comprising:

a lower insulating sheet, an insulating spacer sheet, and an upper insulating sheet stacked on top of each other in order; the lower insulating sheet having a lower keyboard switch contact pattern printed on a first portion thereof, the upper insulating sheet having an upper keyboard switch contact pattern printed on a first portion thereof, said lower and upper keyboard switch contact patterns being positioned operatively facing each other spaced apart by the insulating spacer sheet, and the insulating spacer sheet having means therethrough for permitting electrical contact to be actuated between selected switch contacts of said switch contact patterns;

one portion of the electrical part being a mechanism comprised of the casing, the slide contact in the casing, and means on the casing for mounting said one portion to the composite circuit board; and the upper insulating sheet having means on a second portion thereof for receiving said one portion of the electrical part therethrough, the insulating spacer sheet having another portion of the electrical part printed thereon, including the fixed circuit pattern and terminals, which is placed in operative relation to the slide contact of said one portion of said electrical part when it is received through the upper insulating sheet.

2. A circuit board as set forth in claim 1, wherein at least one of the upper and lower insulating sheets is flexible film.

3. A circuit board as set forth in claim 1, wherein the insulating spacer is a filmy body printed on the insulating sheet that takes the form of film.

4. A circuit board as set forth in claim 1, wherein the terminals of the circuit patterns formed on the insulating spacer are connected with leads included in the switch circuit patterns formed on the lower insulating sheet.

5. A circuit board as set forth in claim 1, wherein the upper insulating sheet is provided with a hole so that the circuit patterns on the insulating spacer sheet are partially exposed, and wherein the mechanisms of the electrical parts are disposed in the hole, the mechanisms having retaining portions extending downward from the opening end of the casings of the mechanisms, the retaining portions being anchored to the circuit board.

6. A composite circuit board as claimed in claim 1, wherein the lower insulating sheet has an electrical connector pattern printed on a second portion thereof which is positioned in connective relation to said terminals of the electrical part printed on the insulating spacer sheet, and further comprising means for conductively connecting said connector pattern of the lower insulating sheet to said terminals printed on said insulating spacer sheet.

7. A composite circuit board as claimed in claim 6, wherein said connector pattern and said lower keyboard switch contact pattern terminate together in one edge connector portion for the lower insulating sheet.

* * * * *